United States Patent
Shivaray et al.

(10) Patent No.: US 10,234,505 B1
(45) Date of Patent: Mar. 19, 2019

(54) CLOCK GENERATION FOR INTEGRATED CIRCUIT TESTING

(71) Applicant: Xilinx, Inc., San Jose, CA (US)

(72) Inventors: Banadappa V. Shivaray, Yadgiri (IN); Ismed D. Hartanto, Castro Valley, CA (US); Alex S. Warshofsky, Miami Beach, FL (US); Pranjal Chauhan, Fatehpur (IN)

(73) Assignee: XILINX, INC., San Jose, CA (US)

( * ) Notice: Subject to any disclaimer, the term of this patent is extended or adjusted under 35 U.S.C. 154(b) by 54 days.

(21) Appl. No.: 15/443,990

(22) Filed: Feb. 27, 2017

(51) Int. Cl.
  *G01R 31/28* (2006.01)
  *G01R 31/317* (2006.01)
  *G01R 31/3177* (2006.01)

(52) U.S. Cl.
  CPC ... *G01R 31/31725* (2013.01); *G01R 31/3177* (2013.01); *G01R 31/31727* (2013.01)

(58) Field of Classification Search
  CPC ........ G01R 31/31725; G01R 31/31727; G01R 31/3177; G01R 31/318547; G01R 31/318575; G01R 31/318544; G01R 31/318552; G01R 31/318555; G01R 31/318536; H03L 7/06
  See application file for complete search history.

(56) References Cited

U.S. PATENT DOCUMENTS

| | | |
|---|---|---|
| 6,668,237 B1 | 12/2003 | Guccione et al. |
| 6,817,006 B1 | 11/2004 | Wells et al. |
| 6,857,092 B1 | 2/2005 | Fox |
| 6,874,107 B2 | 3/2005 | Lesea |
| 6,876,218 B1 | 4/2005 | Simmons et al. |
| 6,891,395 B2 | 5/2005 | Wells et al. |
| 6,944,836 B1 | 9/2005 | Lai |
| 7,080,300 B1 | 7/2006 | Herron et al. |
| 7,102,555 B2 | 9/2006 | Collins et al. |
| 7,117,416 B1 | 10/2006 | Fox |
| 7,188,283 B1 | 3/2007 | Shafer et al. |
| 7,269,805 B1 | 9/2007 | Ansari et al. |

(Continued)

OTHER PUBLICATIONS

Cheon et al.," At-Speed Logic BIST for IP Cores", IEEE, Proceedings of the Design, Automation and Test in Europe Conference and Exhibition (DATE'05), 2 pages.

(Continued)

*Primary Examiner* — Guerrier Merant
(74) *Attorney, Agent, or Firm* — LeRoy D. Maunu (57) ABSTRACT

A disclosed integrated circuit includes first and second clock generation circuits, a stagger circuit, and a plurality of scan chains. The first clock generation circuit receives a first clock signal and generates a first set of clock pulses having a first frequency in response to receipt of a first clock trigger signal and a first enable signal. The second clock generation circuit receives a second clock signal and generates a second set of clock pulses having a second frequency in response to receipt of a second clock trigger signal and a second enable signal. The stagger circuit generates the first and second clock trigger signals from the global trigger signal at different times. The first set of clock pulses are staggered relative to the second set of clock pulses. The plurality of scan chains test functionality of logic circuitry within the IC chip using the first and second set of clock pulses.

20 Claims, 6 Drawing Sheets

(56) References Cited

U.S. PATENT DOCUMENTS

| | | |
|---|---|---|
| 7,302,625 B1 | 11/2007 | Payakapan et al. |
| 7,305,599 B1 | 12/2007 | Duce et al. |
| 7,406,670 B1 | 7/2008 | Ansari et al. |
| 7,409,610 B1 | 8/2008 | Drimer |
| 7,424,655 B1 | 9/2008 | Trimberger |
| 7,454,675 B1 | 11/2008 | Wells et al. |
| 7,493,543 B1 | 2/2009 | Wu et al. |
| 7,546,499 B1 | 6/2009 | Shafer et al. |
| 7,603,599 B1 | 10/2009 | Cossoul et al. |
| 7,620,863 B1 | 11/2009 | Trimberger |
| 7,626,874 B1 | 12/2009 | Fan et al. |
| 7,725,787 B1 | 5/2010 | Wells et al. |
| 7,761,755 B1 | 7/2010 | Payakapan et al. |
| 7,917,820 B1 | 3/2011 | Pavle et al. |
| 9,411,701 B2 | 8/2016 | Azad |
| 9,798,352 B1* | 10/2017 | Majumdar ............... G06F 1/10 |
| 2002/0120896 A1 | 8/2002 | Wang et al. |
| 2007/0022339 A1* | 1/2007 | Branch .......... G01R 31/318552 |
| | | 714/726 |
| 2007/0204194 A1* | 8/2007 | Grise ............... G01R 31/31727 |
| | | 714/738 |
| 2009/0063921 A1 | 3/2009 | Aipperspach et al. |
| 2012/0173943 A1* | 7/2012 | Cesari ............ G01R 31/318552 |
| | | 714/731 |
| 2014/0164860 A1* | 6/2014 | Kim ............... G01R 31/318536 |
| | | 714/731 |
| 2014/0189452 A1* | 7/2014 | Sonawane ...... G01R 31/318552 |
| | | 714/727 |
| 2014/0189454 A1* | 7/2014 | Puvvada ........ G01R 31/318544 |
| | | 714/729 |
| 2015/0137862 A1* | 5/2015 | Bahl ............ G01R 31/318552 |
| | | 327/145 |
| 2015/0219717 A1* | 8/2015 | Ahrens .......... G01R 31/318547 |
| | | 714/727 |

OTHER PUBLICATIONS

Xilinx Quality, "Verfication and Characterization", 2012, 6 pages, Xilinx, Inc. San Jose, CA USA.

\* cited by examiner

CLOCK GENERATION FOR INTEGRATED CIRCUIT TESTING

TECHNICAL FIELD

The disclosure generally relates to self-testing circuits and devices, and more particularly to generating clocks for use by logic providing the self-test functionality.

BACKGROUND

Built-in self-test (BIST) logic can be included as part of integrated circuit (IC) chips in order to test internal logic. Logic built-in self-test (LBIST) is an example of self-test logic that can verify the functional logic of a chip. LBIST uses a process that is similar to memory BIST (MBIST), which is used to test memory contents. The LBIST can test the circuit logic by using an output of an automatic test pattern generation (ATPG) or a pseudo-random pattern generator (PRPG) to generate input signals that are scanned into latches of scan chains or scan channels. The scan chains can include multiple scan elements and shift registers that are arranged in a serial chain. Control logic (e.g., in the form of a state machine) generates clock(s) that are provided to the scan chains and that control the capture of output from the scan chains. The captured output values are then scanned into a multiple-input shift register (MISR). The MISR values can then be used to verify the circuit functionality.

Examples of ICs that can use built-in self-test logic include, but are not limited to, digital signal processors (DSPs), general purpose computer processors, programmable integrated circuits, programmable logic devices (PLDs), and System on Chip (SoC) devices. PLDs are a type of programmable integrated circuit (IC) that can be programmed to perform specified logic functions. One type of PLD, the field programmable gate array (FPGA), can include an array of programmable tiles. These programmable tiles comprise various types of logic blocks, which can include, for example, input/output blocks (IOBs), configurable logic blocks (CLBs), dedicated block random access memory (BRAM), multipliers, digital signal processing blocks (DSPs), processors, clock managers, delay locked loops (DLLs), bus or network interfaces such as Peripheral Component Interconnect (PCI), PCI Express (PCIe), Ethernet, and so forth. Some devices include enough components and functionality to effectively serve as an entire computer system on a single IC chip. Devices with such functionality are sometimes referred to as SoCs. Some SoC devices can include programmable logic that is similar to programmable logic provided by various PLDs.

The various circuits can suffer from issues with long self-test run time, timing issues when running self-tests on IC chips with multiple clock domains, and high dynamic power consumption during self-testing. These and other problems can be problematic for self-test circuits and their operation.

SUMMARY

An implementation of an integrated circuit (IC) chip includes first and second clock generation circuits, a stagger circuit, and a plurality of scan chains. The first clock generation circuit is configured and arranged to receive a first clock signal having a first frequency and to generate a first set of clock pulses having the first frequency in response to receipt of a first clock trigger signal and a first enable signal. The second clock generation circuit is configured to receive a second clock signal having a second frequency, and to generate a second set of clock pulses having the second frequency in response to receipt of a second clock trigger signal and a second enable signal. The stagger circuit is coupled to receive a global trigger signal, and the stagger circuit is configured to generate the first and second clock trigger signals from the global trigger signal at different times. The first set of clock pulses are staggered relative to the second set of clock pulses. The plurality of scan chains is configured to test functionality of logic circuitry within the IC chip using the first and second set of clock pulses.

A method for use with an integrated circuit (IC) chip includes using a first clock generation circuit to receive a first clock signal having a first frequency, and to generate a first set of clock pulses having the first frequency in response to receipt of a first clock trigger signal and a first enable signal. The method further includes using a second clock generation circuit to receive a second clock signal having a second frequency, and to generate a second set of clock pulses having the second frequency in response to receipt of a second clock trigger signal and a second enable signal. The method generates, using a stagger circuit that inputs a global trigger signal, the first and second clock trigger signals from the global trigger signal at different times. The first and second sets of clock pulses are staggered in response to the first and second clock trigger signals, and functionality of logic circuitry within the IC chip is tested using a plurality of scan chains and the first and second set of clock pulses.

Other features will be recognized from consideration of the Detailed Description and Claims, which follow.

BRIEF DESCRIPTION OF THE DRAWINGS

Various aspects and features of the method, device, and system will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Various implementations are directed toward a self-test solution in which clocks having timing interrelationships can be pulsed within a single capture window. The clock pulses are staggered to avoid timing issues relating to a data race condition across different clock domains. Staggered clock pulses are clock pulses that occur at different times. A plurality of clock generation circuits generate the respective clock pulses in response to respective clock trigger signals. The individual clock trigger signals are generated from a global clock trigger signal. The global clock trigger signal is passed through a stagger circuit that generates the individual clock trigger signals to the clock generation circuits.

For ease of discussion, the term "incompatible clocks" represents asynchronous clocks that are subject to a possible data race condition between the respective clock domains when the respective clocks are pulsed together. The term "compatible clocks" represents clocks that can be pulsed together without a data race condition.

The staggering of clock pulses within the same capture window can be particularly useful for reducing the test time as well as for reducing the dynamic power drawn during the test procedure. With respect to the test time, more test coverage can be achieved in fewer patterns. While staggering clocks can add a few cycles within the capture window, there can still be a net reduction in test time, e.g., relative to overhead associated with using multiple capture cycles for an equivalent test coverage. With respect to dynamic power, the staggering of the clocks spreads the power draw over a longer period of time than a period in which all of the clocks pulsed at the same time. Dynamic power can potentially cause a high voltage drop, which is a function of the current draw. If the voltage drop is great enough, the drop could cause an undesired logic function that results in false failure being detected during the self-test.

Figure 1:
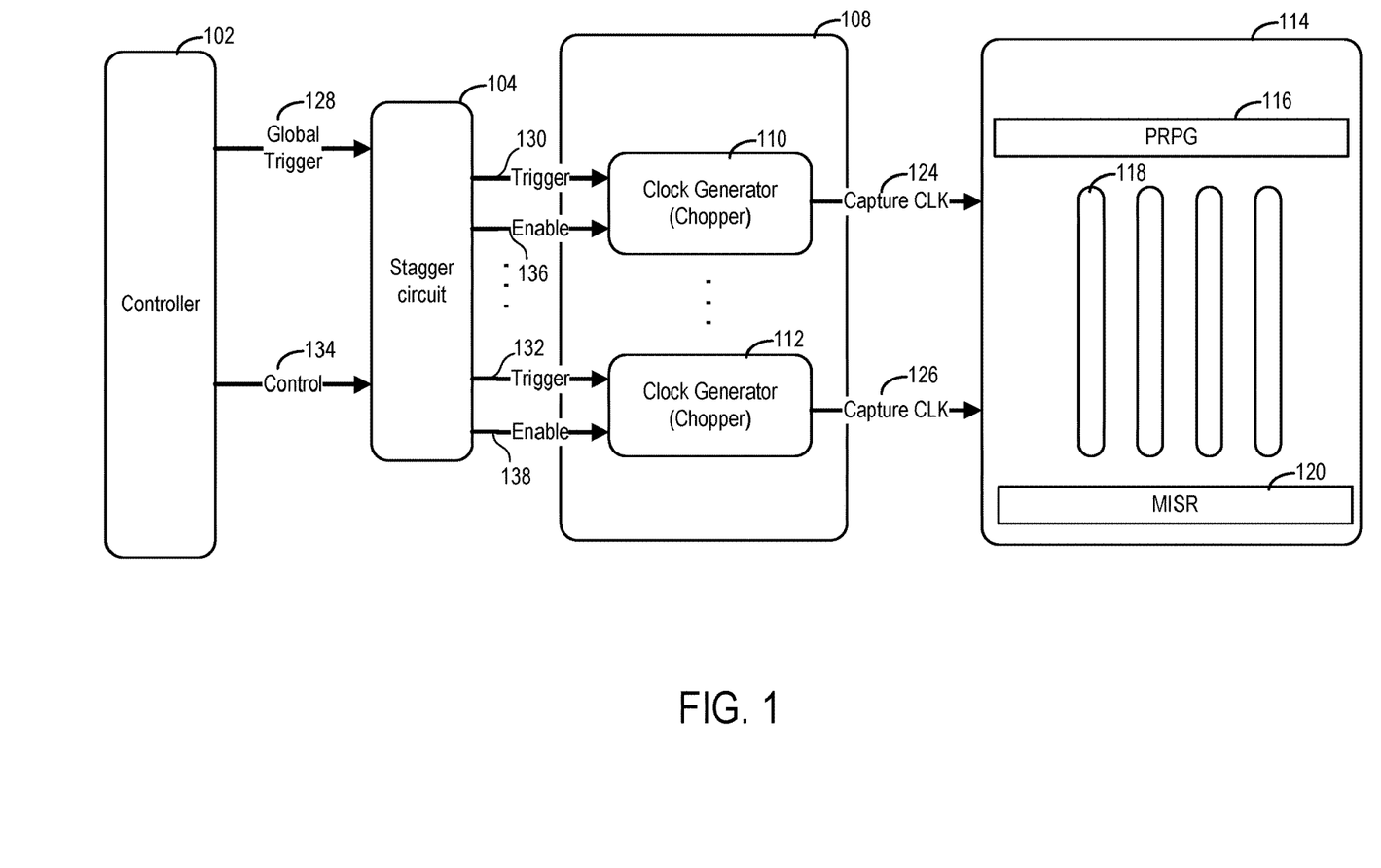
FIG. 1 is a is a block diagram of a system for providing staggered clocks to a plurality of scan chains.

Turning now to the figures, FIG. 1 is a block diagram of a system for providing staggered clocks to a plurality of scan chains. The block diagram includes several different components that are located within an IC chip for the purpose of providing self-test capabilities. In particular implementations, the self-test can be an LBIST. A self-test controller block 102 includes a hardware logic circuit that generates control signals 134 for implementing a self-test of logic circuit 114. According to various implementations, the self-test controller block 102 can receive input (control and clock) signals from sources external to the IC chip. The input signals can be provided during the manufacturing test process. "Named capture procedures" (NCPs) can be used to specify the functionality and relationships between the internal and external signals. The relationships can then be used to create accurate at-speed test patterns driven by the on-chip clocks. NCPs can define which clock signals are generated along with control signals 134 to select the timing of the clock signals.

According to various implementations, the controller 102 generates a global trigger signal 128. The global trigger signal is provided to the input of a stagger circuit 104. The stagger circuit 104 generates respective trigger signals 130 . . . 132 and respective enable signals 136 . . . 138 to the clock generator circuits 110 . . . 112. The stagger circuit staggers the respective trigger signals to the clock generator circuits. In one implementation, the stagger circuit includes a pipeline circuit having multiple pipeline stages. The outputs of some of the pipelined stages are used as respective individual trigger signals. The stagger circuit 104 passes the global trigger signal though the pipeline stages so that the timing by which the global trigger signal arrives at each stage can be used to generate a set of staggered individual trigger signals. In other implementations, the trigger signals can be staggered by a state machine or other circuits.

Clock generation block 108 includes multiple clock generation circuits 110, . . . , 112. In particular implementations, the clock generation block 108 operates chopper circuits that can generate sets of pulses that operate at a frequency of a corresponding input clock (the pulses are therefore sometimes referred to as a 'chopped' version of the input clock). Each clock generator circuit 110, . . . , 112 is responsive to a respective trigger signal 130, . . . , 132. Each clock generator circuit 110, . . . , 112 can also be responsive to a corresponding and respective enable signal 136, . . . 138. The enable signals can be specified in the NCPs for enabling and disabling individual ones of the clock generator circuits in providing capture clock signals to the scan chains.

The capture clock signals 124, . . . , 126 are provided to the circuit logic 114 and used to drive the logic. For example, a PRPG 116 can generate input test data vectors used to drive inputs of the scan chains 118, which can include multiple scan elements and shift registers that are arranged in a serial chain. The logic being tested within the scan chains can be timed by the capture clocks. For example, one of the scan chains 118 is coupled to receive the capture clock signal 124, and another one of the scan chains is coupled to receive the capture clock signal 126. The output test data vectors from the scan chains can then be stored in the MISR 120.

According to various implementations, the controller can configure the self-test to operate in various different modes. Two such modes include a stuck-at fault mode and an at-speed mode. The stuck-at fault mode can be designed to generate clock pulses that have a single pulse or that operate at the same frequency (e.g., generated by the same reference clock). The clock pulses are generated in response to receipt of a corresponding individual trigger signal and are therefore staggered relative to the pipeline and the clock generation circuits. For the at-speed mode, the clock generation circuits can each generate multiple pulses, which are also responsive to the individual trigger signals. The number of pulses that are generated in response to an individual trigger signal can be adjusted as desired. The pulses are generated at a frequency that corresponds to the particular clock domain of the logic being tested. Thus, each clock generation circuit has the potential to generate pulses at a different clock frequency.

Figure 2:
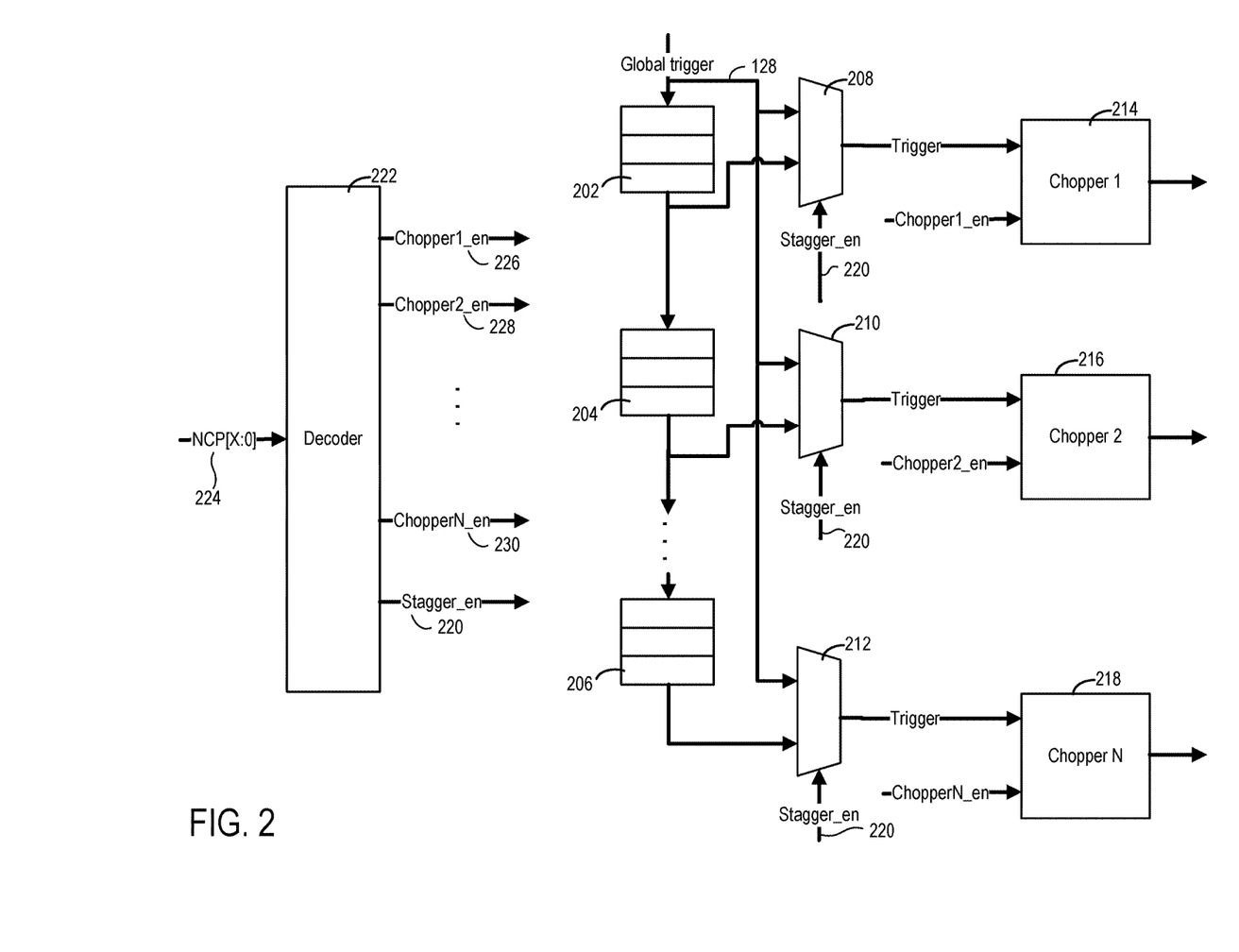
FIG. 2 depicts a block diagram of a circuit that supports enabling and disabling of clock staggering.

According to various implementations, the system can be designed to disable the staggering of clock signals for particular modes and configuration. FIG. 2 depicts a block diagram of a circuit that supports enabling and disabling of the staggering of clock signals. The global trigger signal is provided to a particular implementation of a stagger circuit that includes a pipeline circuit having multiple pipeline stages. The outputs of pipeline stages 202, 204, . . . 206 are provided as respective inputs to the selection multiplexers 208, 210, . . . , 212. The other input to the multiplexers is the global trigger signal 128. The control signal stagger_en 220 is provided by the decoder circuit 222 as a selection control signal for each of the selection multiplexers 208, 210, and 212. In one state of the stagger_en signal, the global trigger signal is provided to each of the chopper (clock generation) circuits 214, 216, . . . , 218, and each chopper circuit generates corresponding clock pulse(s) at the same time. In the other state, a different individual trigger signal is provided to each of chopper circuits 214, 216, . . . , 218, and each chopper circuit generates a corresponding set of clock pulses at a staggered intervals corresponding to the timing of the individual pipeline stages.

The input of the decoder circuit 222 is an input control signal 224 that defines an NCP indicative of which chopper circuits are enabled for a particular capture window. The input control signal can also define whether or not the trigger signal for the chopper circuits is staggered. The output of the decoder circuit includes a set of respective enable signals 226, 228, ... 230 for the chopper circuits 214, 216, ... 218. The decoder circuit 222 can be particularly useful for simplifying the configuration of the self-test circuit by providing an interface between NCP registers and the chopper circuits.

Figure 3:
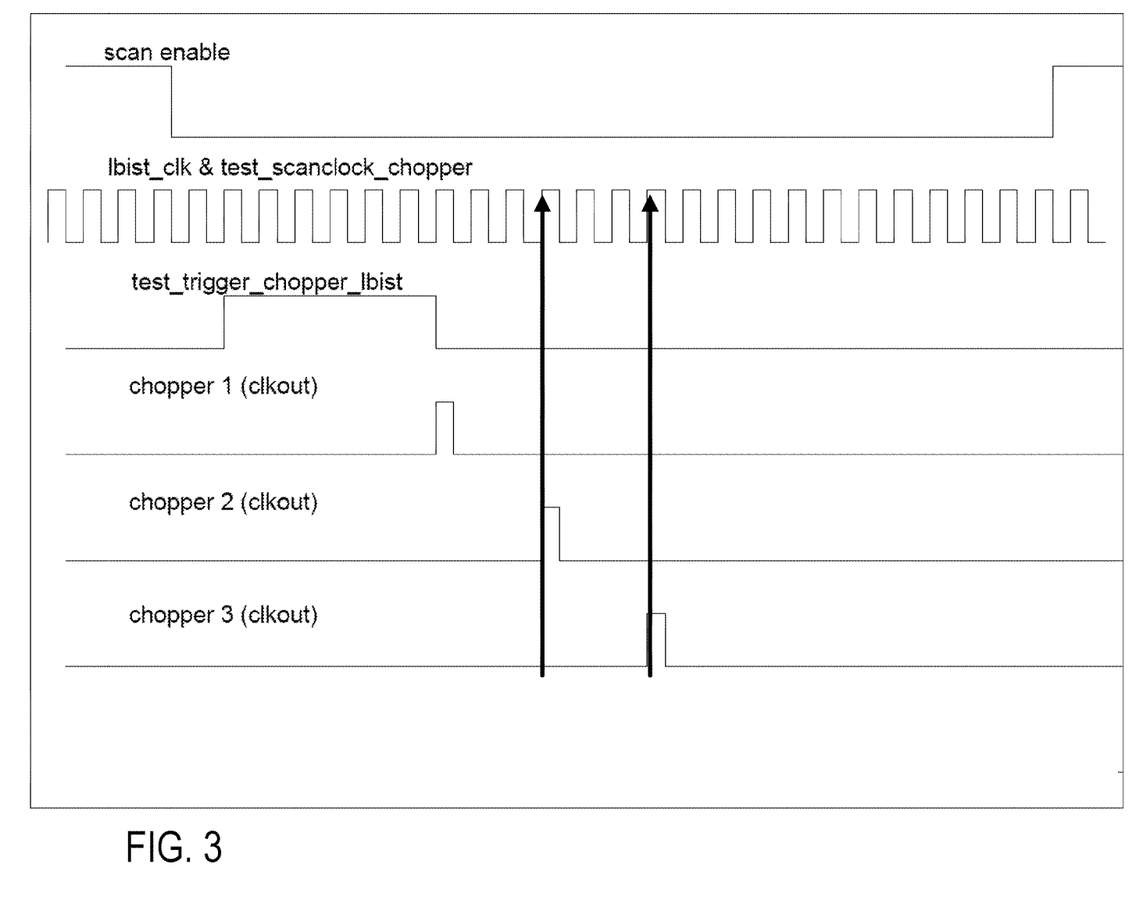
FIG. 3 depicts a capture timing diagram of staggered clock outputs for a stuck-at fault mode.

FIG. 3 depicts a capture timing diagram of staggered clock outputs for a stuck-at fault mode, consistent with implementations of the present disclosure. The chopper circuits corresponding to the timing diagram are configured to provide a single pulse during the (LBIST) capture mode. The scan enable signal indicates the start and stop for the capture window. The lbist_clk is used by the stagger circuit to control the timing for each of the pipeline stages. A version of the lbist_clk (test_scanclock_chopper) is also provided to each of the chopper circuits. The test_trigger_chopper_lbist signal serves as a global trigger signal for the chopper circuits. In the depicted timing diagram, the stagger circuit is enabled and has three pipeline stages between each individual clock trigger signal. Each chopper therefore generates a clock signal that is staggered by three clock periods of the LBIST_CLK.

In the stuck-at fault mode, the test_scanclock_chopper, which is synchronous to the lbist_clk, can be used as the source of the clkout pulses for each chopper circuit. The clkout signals are therefore shown as being synchronous to the lbist_clk.

The setup requirement/check from the timing diagram is 3 cycles (3 stages of pipelining) and there is no hold requirement/check to be done. Depending on the static timing analysis (STA) complexity for the inter-clock domain timing of the design, the number of pipeline stages can be 1, 2 ... N where N is a whole number. For many designs, N=3 is sufficiently large to resolve timing related issues for inter clock domains.

The timing diagram shows that the capture frequency is relatively pulsed only once during the entire capture phase, which is relatively slow. The LBIST (setup and hold timing) places the same timing requirements as that of stuck-at scan (setup and hold timing).

Figure 4:
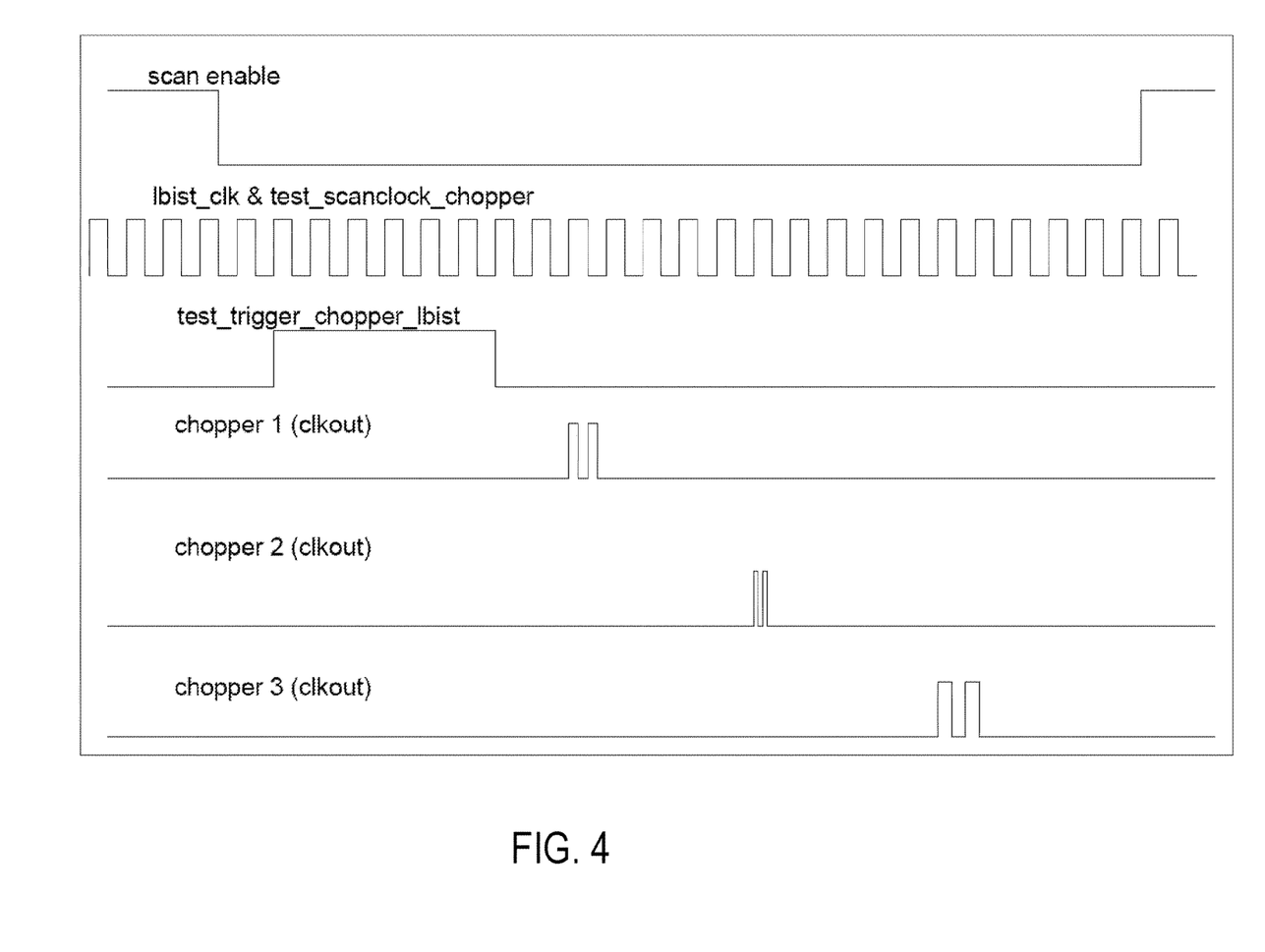
FIG. 4 depicts a capture timing diagram of staggered clock outputs for an at-speed mode.

FIG. 4 depicts a capture timing diagram of staggered clock outputs for an at-speed mode, consistent with implementations of the present disclosure. The scan enable, lbist_clk, test_scanclock_chopper, and test_trigger_chopper_lbist signals are similar to those discussed in connection with FIG. 3. Description of the similar functionality is not repeated for the sake of brevity. For the at-speed mode, the chopper circuits are configured to generate two pulses according a functional clock speed for each chopper circuit. The functional clock speed can be set based upon the desired operational frequency of the logic being tested and driven using each clockout signal. For instance, each chopper circuit can receive a corresponding functional clock having a different frequency. Further, the different functional clocks can be asynchronous in terms of their respective phase relationships. In certain implementations, the functional clocks have frequencies that correspond to the maximum allowed frequency for the logic being tested.

The max setup requirement/check from the timing diagram is greater than or equal to 4 cycles (5 stages of pipelining) and there is no hold requirement/check to be done. Depending on the STA complexity for the inter-clock domain timing of the design, the number of pipeline stages can be 1, 2 ... N where N is a whole number. For many designs N=4 or 5 is sufficiently large to resolve timing related issues.

Figure 5:
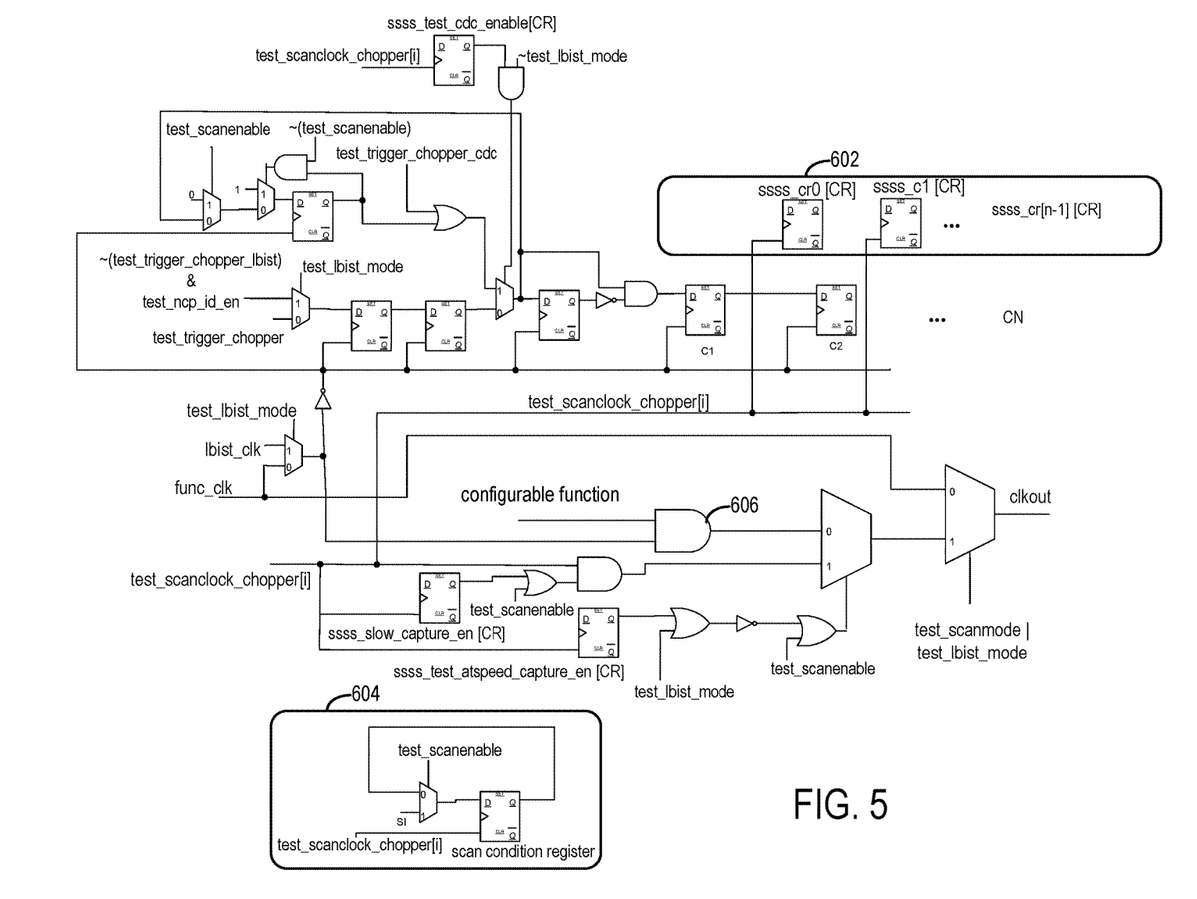
FIG. 5 depicts a circuit diagram of a clock generation (chopper) circuit.

FIG. 5 depicts a circuit diagram of a clock generation (chopper) circuit, consistent with implementations of the present disclosure. The chopper circuit uses lbist_clk as stuck-at capture clock, and is hardcoded to provide a single pulse in lbist capture mode. In transition LBIST mode, lbist_clk can be driven from a functional max frequency clock and can be hardcoded to provide 2 pulses in LBIST capture mode.

The input and output signals of the depicted chopper are briefly described in the following table:

| Pin | Pin Direc | Description. |
|---|---|---|
| test_trigger_chopper_cdc | Input | Used to trigger synchronous clock domain crossing testing. For LBIST testing it can be connected to 1'b0. |
| test_trigger_chopper | Input | Used to trigger at_speed clock pulses. For LBIST testing it can be connected to 1'b0. |
| func_clk | Input | Free running Fmax functional clock, the chopper is used to override functional clock to provide different DFT clocks in different DFT modes. |
| lbist_clk | Input | Free running LBIST clock used to provide stuck_at/ at_speed lbist capture clock. |
| test_scanclock_chopper | Input | The scan / lbist shift clock, In LBIST testing this clock is driven from LBIST controller. |
| test_scanenable | Input | The scanenable pin of chopper is driven from LBIST |
| test_scanmode | Input | High during scan mode. For LBIST testing this pin can be tied to 1'b0. |
| test_lbist_mode | Input | pin is high during LBIST testing. In Non LBIST mode this pin is zero. |
| test_ncp_id_en | Input | Used to enable a particular chopper in different lbist capture cycle depending on the selected NCP. |
| test_trigger_chopper_lbist | Input | Driven from LBIST controller and is used to trigger LBIST pulses. |
| test_scan_atspeed_en | Input | Pin is 1'b0 for LBIST testing. |
| test_scan_in | Input | Chopper scan in used in regular scan mode. It will be 1'b0 during LBIST testing. |
| test_scan_out | Output | Chopper scan out used in regular scan mode. The output can be ignored for LBIST testing. |
| Clkout | Output | Used to trigger synchronous clock domain crossing testing. For LBIST testing it can be connected to 1'b0. |

The circuit 604 shows the configuration for the registers labelled with the condition registers ([CR]). The condition registers 602 can be loaded with any value as part of scan shift. During capture the registers maintain the scan state. According to various embodiments, the number of condition registers in section 602 is configurable for each chopper circuit. The configurability supports the capability of having a corresponding number of capture pulses during at-speed testing.

According to various implementations, the condition registers form a separate chopper chain and are directly accessible from the pads as a scan chain during regular scan testing. The separate/dedicated scan chain information can be provided as part of ATPG (Automated Test Pattern Generation) setup. According to particular implementations, the value from the CR bits are overridden using test_lbist_mode to generate a single pulse during LBIST capture.

AND gate 606 gates the func_clk based upon a configurable function that can be set for each chopper circuit. For example, a design with 2 at_speed pulses (Hard coded 2 pulses in LBIST capture) can use a function: func clk gated=func clk & ((C1 & (ssss_cr0|test_lbist_mode))+(C2 & (ssss_cr1| test_lbist_mode))+(C2 & (ssss_cr2 &~test_lbist_mode))+(C3 & (ssss_cr3 &~test_lbist_mode))+(Cn & (ssss_crn &~test_lbist_mode))).

For a design with 3 at_speed pulses (Hard coded 3 pulses in LBIST capture): func clk gated=func clk & ((C1 & (ssss_cr0|test_lbist_mode))+(C2 & (ssss_cr1|test_lbist_mode))+(C2 & (ssss_cr2|test_lbist_mode))+(C3 & (ssss_cr3 &~test_lbist_mode))+(Cn & (ssss_crn &~test_lbist_mode))).

According to various implementations, the ssss_cr[x] bits can be configured on a per pattern basis during LBIST capture. The number of pulses for different patterns can be configured during TK-LBIST tool IP Generation: func clk gated=func clk & ((C1 & ssss_cr0)+(C2 & ssss_cr1)+(C2 & ssss_cr2)+(C3 & ssss_cr3)+(Cn & ssss_crn)).

Figure 6:
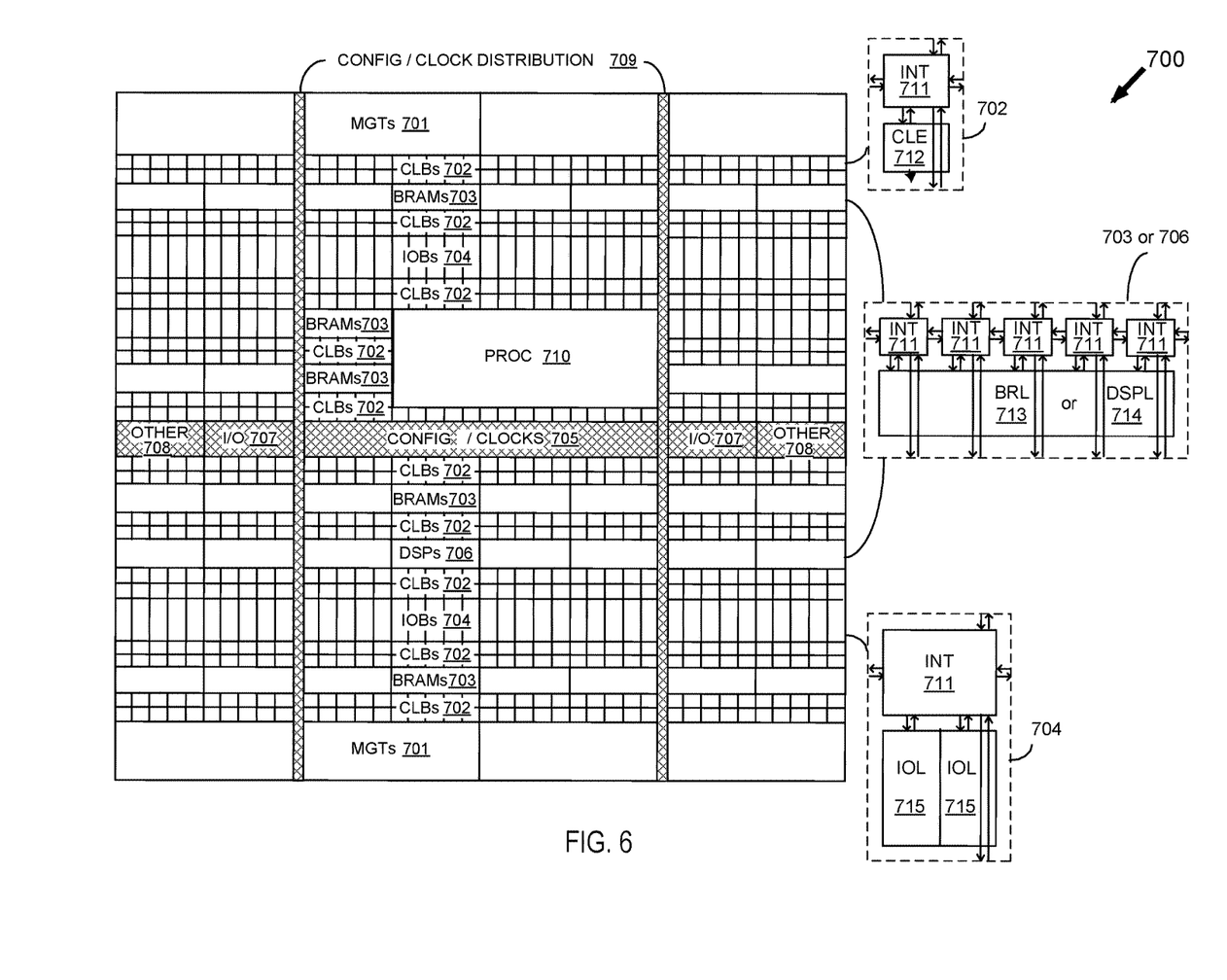
FIG. 6 shows a programmable integrated circuit (IC) on which the disclosed circuits and processes may be implemented.

FIG. 6 shows a programmable integrated circuit (IC) 700 on which the disclosed circuits and processes may be implemented. The programmable IC may also be referred to as a System on Chip (SOC) that includes field programmable gate array logic (FPGA) along with other programmable resources. FPGA logic may include several different types of programmable logic blocks in the array. For example, FIG. 6 illustrates a programmable IC 700 that includes a large number of different programmable tiles including multi-gigabit transceivers (MGTs) 701, configurable logic blocks (CLBs) 702, blocks of random access memory (BRAMs) 703, input/output blocks (IOBs) 704, configuration and clocking logic (CONFIG/CLOCKS) 705, digital signal processing blocks (DSPs) 706, specialized input/output blocks (I/O) 707, for example, clock ports, and other programmable logic 708 such as digital clock managers, analog-to-digital converters, system monitoring logic, and so forth. Some programmable IC having FPGA logic also include dedicated processor blocks (PROC) 710 and internal and external reconfiguration ports (not shown).

In some FPGA logic, each programmable tile includes a programmable interconnect element (INT) 711 having standardized connections to and from a corresponding interconnect element in each adjacent tile. Therefore, the programmable interconnect elements taken together implement the programmable interconnect structure for the illustrated FPGA logic. The programmable interconnect element INT 711 also includes the connections to and from the programmable logic element within the same tile, as shown by the examples included at the top of FIG. 6.

For example, a CLB 702 can include a configurable logic element CLE 712 that can be programmed to implement user logic, plus a single programmable interconnect element INT 711. A BRAM 703 can include a BRAM logic element (BRL) 713 in addition to one or more programmable interconnect elements. Often, the number of interconnect elements included in a tile depends on the height of the tile. In the pictured implementation, a BRAM tile has the same height as five CLBs, but other numbers (e.g., four) can also be used. A DSP tile 706 can include a DSP logic element (DSPL) 714 in addition to an appropriate number of programmable interconnect elements. An IOB 704 can include, for example, two instances of an input/output logic element (IOL) 715 in addition to one instance of the programmable interconnect element INT 711. As will be clear to those of skill in the art, the actual I/O bond pads connected, for example, to the I/O logic element 715, are manufactured using metal layered above the various illustrated logic blocks, and typically are not confined to the area of the input/output logic element 715.

In the pictured implementation, a columnar area near the center of the die (shown shaded in FIG. 6) is used for configuration, clock, and other control logic. Horizontal areas 709 extending from the column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 6 include additional logic blocks that disrupt the regular columnar structure making up a large part of the programmable IC. The additional logic blocks can be programmable blocks and/or dedicated logic. For example, the processor block PROC 710 shown in FIG. 6 spans several columns of CLBs and BRAMs.

Note that FIG. 6 is intended to illustrate only an example of programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 6 are provided purely as examples. For example, in an actual programmable IC, more than one adjacent column of CLBs is typically included wherever the CLBs appear, to facilitate the efficient implementation of user logic.

According to certain implementations, the processing elements are arranged in an array within a PLD or FPGA. Each processing element in the array can be implemented in a small predefined region guaranteed to be around a DSP slice to provide easily repeatable timing closure at high clock rates. Logic inside the PE is kept simple. A processing register file interface can be provided using the existing distributed SRAM interface of the FPGA. Global logic of the FPGA can be configured to perform data translations necessary to use the interface in this new fashion.

For columnar PLD/FPGA architectures using repeatable tiles arranged in columns across the die, the DSP slice row pitch can often be fixed. Control and data signals crossing a row are pipelined by a single stage to achieve a high clock rate. To compensate for timing variations caused by differing column pitches (e.g., due to the existence of other columns in between two DSP supertile columns), row pipeline stages can be added to allow the row pipelines to run at the same clock rate.

For the various flow diagrams depicted herein, the particular orders of the blocks and associated functions are provided as examples. The ordering is not necessarily limiting and can be varied according to various implementations.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems that use self-test circuitry. Other aspects and features will be apparent to those skilled in the art from consideration of the specification. The portions of the methods and system may be implemented as one or more processors configured to execute software, as an application specific integrated circuit (ASIC), or as a logic on a programmable logic device. Moreover, the various circuits identified herein may share hardware circuitry, such as use of a common computer processing unit or digital processing unit. It is intended that the specification and drawings be considered as examples only, with a true scope of the invention being indicated by the following claims.

What is claimed is:

1. An integrated circuit (IC) chip comprising:
a first clock generation circuit configured to:
receive a first clock signal having a first frequency; and
generate, in response to receipt of a first clock trigger signal and a first enable signal, a first set of clock pulses having the first frequency;
a second clock generation circuit configured to:
receive a second clock signal having a second frequency unequal to the first frequency; and
generate, in response to receipt of a second clock trigger signal and a second enable signal, a second set of clock pulses having the second frequency;
a stagger circuit coupled to receive a global trigger signal, wherein the stagger circuit is configured to generate the first and second clock trigger signals from the global trigger signal at different times, and the first set of clock pulses are staggered relative to the second set of clock pulses during a capture phase; and
a plurality of scan chains configured to test functionality of logic circuitry within the IC chip using the first and second sets of clock pulses.

2. The IC chip of claim 1, wherein the stagger circuit includes a pipeline circuit coupled to receive the global trigger signal, and the pipeline circuit is configured to pass the global trigger signal between pipeline stages according to a third clock signal and generate the first and second clock trigger signals at different pipeline stages.

3. The IC chip of claim 1, further comprising a pseudo-random pattern generator clocked by a third clock signal and configured to generate test data vectors that are provided to the plurality of scan chains.

4. The IC chip of claim 1, further comprising an output shift register clocked by a third clock signal and configured to store test data vectors that are provided from the plurality of scan chains.

5. The IC chip of claim 1, wherein the first and second clock generation circuits are connected to first and second multiplexers, respectively, the first multiplexer is configured to select between the first clock trigger signal and the global trigger signal for input to the first clock generation circuit, and the second multiplexer is configured to select between the second clock trigger signal and the global trigger signal for input to the second clock generation circuit.

6. The IC chip of claim 1, wherein the first and second clock signals are asynchronous to each other.

7. The IC chip of claim 1, wherein the first and second clock signals are synchronous to each other.

8. The IC chip of claim 1, wherein the plurality of scan chains includes a first scan chain in a first clock domain and a second scan chain in a second clock domain, the first scan chain is coupled to receive the first set of clock pulses, the second scan chain is coupled to receive the second set of clock pulses.

9. The IC chip of claim 1, wherein the stagger circuit further includes a decoder circuit, and the decoder circuit is configured and arranged to:
input a control signal; and
generate the first and second enable signals to the first and second clock generation circuits in response to the control signal;
wherein:
the first clock generation circuit is configured to generate the first set of clock pulses in response to a first state of the first enable signal and not generate the first set of clock pulses in response to a second state of the first enable signal; and
the second clock generation circuit is configured to generate the second set of clock pulses in response to a first state of the second enable signal and not generate the second set of clock pulses in response to a second state of the second enable signal.

10. The IC chip of claim 1, wherein the stagger circuit further includes a decoder circuit, and the decoder circuit is configured and arranged to:
input a control signal; and
generate a stagger enable signal in response to the control signal;
wherein the stagger circuit is further configured and arranged to generate the first and second clock trigger signals from the global trigger signal at different times in response to a first state of the stagger enable signal, and to generate the first and second clock trigger signals from the global trigger signal at the same time in response to a second state of the stagger enable signal.

11. A method for use with an integrated circuit (IC) chip, the method comprising:
using a first clock generation circuit to:
receive a first clock signal having a first frequency; and
generate, in response to receipt of a first clock trigger signal and a first enable signal, a first set of clock pulses having the first frequency;
using a second clock generation circuit to:
receive a second clock signal having a second frequency unequal to the first frequency; and
generate, in response to receipt of a second clock trigger signal and a second enable signal, a second set of clock pulses having the second frequency;
generating, using a stagger circuit that inputs a global trigger signal, the first and second clock trigger signals from the global trigger signal at different times;
staggering the first and second sets of clock pulses during a capture phase in response to the first and second clock trigger signals; and
testing functionality of logic circuitry within the IC chip using a plurality of scan chains and the first and second sets of clock pulses.

12. The method of claim 11, further comprising:
passing the global trigger signal between pipeline stages of a pipeline circuit; and
providing the first and second clock trigger signals from different ones of the pipeline stages.

13. The method of claim 11, further comprising clocking a pseudo-random pattern generator (116) by a third clock signal to generate test data vectors that are provided to the plurality of scan chains.

14. The method of claim 11, further comprising clocking an output shift register by a third clock signal to store test data vectors that are provided from the plurality of scan chains.

15. The method of claim 11, further comprising:
selecting, using a first multiplexer connected to the first clock generation circuit, between the first clock trigger signal and the global trigger signal; and selecting, using a second multiplexer connected to the second clock generation circuit, between the second clock trigger signal and the global trigger signal.

16. The method of claim 11, wherein the first and second clock signals are asynchronous to each other.

17. The method of claim 11, wherein the first and second clock signals are synchronous to each other.

18. The method of claim 11, wherein the plurality of scan chains includes a first scan chain in a first clock domain and a second scan chain in a second clock domain, and the method further comprising applying the first set of clock pulses to the first scan chain, and applying the second set of clock pulses to the second scan chain.

19. The method of claim 11, wherein the stagger circuit further includes a decoder circuit, the method further comprising:
   inputting a control signal to the decoder circuit; and
   generating the first and second enable signals to the first and second clock generation circuits in response to the control signal;
   wherein:
      the generating the first set of clock pulses includes generating the first set of clock pulses in response to a first state of the first enable signal and not generating the first set of clock pulses in response to a second state of the first enable signal; and
      the generating the second set of clock pulses includes generating the second set of clock pulses in response to a first state of the second enable signal and not generate the second set of clock pulses in response to a second state of the second enable signal.

20. The method of claim 11, wherein the stagger circuit further includes a decoder circuit, and the method further comprising:
   inputting a control signal to the decoder circuit;
   generating a stagger enable signal in response to the input control signal; and
   generating by the stagger circuit, the first and second clock trigger signals from the global trigger signal at different times in response to a first state of the stagger enable signal, and generating the first and second clock trigger signals from the global trigger signal at the same time in response to a second state of the stagger enable signal.

* * * * *